(12) United States Patent
Wanke et al.

(10) Patent No.: US 7,376,403 B1
(45) Date of Patent: May 20, 2008

(54) TERAHERTZ RADIATION MIXER

(75) Inventors: Michael C. Wanke, Albuquerque, NM (US); S. James Allen, Santa Barbara, CA (US); Mark Lee, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 461 days.

(21) Appl. No.: 11/113,635

(22) Filed: Apr. 25, 2005

(51) Int. Cl.
*H04B 1/18* (2006.01)

(52) U.S. Cl. .................. 455/189.1; 455/209; 455/293; 455/331; 455/333; 257/19; 257/192; 257/270

(58) Field of Classification Search ............. 455/189.1, 455/209, 293, 331, 333; 358/180; 257/19, 257/192, 270
See application file for complete search history.

(56) References Cited

U.S. PATENT DOCUMENTS

| | | | |
|---|---|---|---|
| 5,081,512 A * | 1/1992 | Kelly et al. ................. | 257/270 |
| 5,339,457 A * | 8/1994 | Kawasaki et al. .......... | 455/333 |
| 6,563,622 B2 * | 5/2003 | Mueller et al. ............. | 398/182 |
| 6,661,039 B1 | 12/2003 | Lee et al. | |
| 7,145,167 B1 * | 12/2006 | Chu ............................ | 257/19 |
| 2006/0081889 A1 * | 4/2006 | Shur et al. ................... | 257/221 |
| 2006/0135110 A1 * | 6/2006 | Przybysz et al. ........... | 455/331 |
| 2007/0200142 A1 * | 8/2007 | Lee et al. .................... | 257/192 |

OTHER PUBLICATIONS

M. Dyakonov, *Detection, Mixing, and Frequency Multiplication of Terahertz Radiation by Two-Dimensional Electronic Fluid*, IEEE Transactionson Electron Devices, vol. 43, No. 3, Mar. 1996, 380-387.

X. G. Peralta, *THz Detection by Resonant 2-D Plasmons in Field Effect Devices*, International Journal of High Speed Electronics and Systems, vol. 12, No. 3 (2002) 925-937.

X. G. Peralta, *Terahertz photoconductivity and plasmon modes in double-quantum-well field-effect transistors*, Applied Physics Letters, vol. 81, No. 9, Aug. 26, 2002, 1627-1629.

M. Lee, *Ballistic cooling in a wideband two-dimensional electron gas bolometric mixer*, Applied Physics Letters, vol. 81, No. 7, Aug. 12, 2002, 1243-1245.

W. Knap, *Resonant detection of subterahertz and terahertz radiation by plasma waves in submicron field-effect transistors*, Applied Physics Letters, vol. 81, No. 24, Dec. 9, 2002, 4637-4639.

H. F. Merkel, *Bolometric Receivers for Terahertz Applications*, Proc. Of SPIE, vol. 4855, (2003), 383-394.

(Continued)

*Primary Examiner*—Sanh D. Phu
(74) *Attorney, Agent, or Firm*—Kevin W. Bieg

(57) ABSTRACT

A terahertz radiation mixer comprises a heterodyned field-effect transistor (FET) having a high electron mobility heterostructure that provides a gatable two-dimensional electron gas in the channel region of the FET. The mixer can operate in either a broadband pinch-off mode or a narrow-band resonant plasmon mode by changing a grating gate bias of the FET. The mixer can beat an RF signal frequency against a local oscillator frequency to generate an intermediate frequency difference signal in the microwave region. The mixer can have a low local oscillator power requirement and a large intermediate frequency bandwidth. The terahertz radiation mixer is particularly useful for terahertz applications requiring high resolution.

22 Claims, 11 Drawing Sheets

OTHER PUBLICATIONS

V. V. Popov, *Absorption of terahertz radiation by plasmon modes in a grid-gated double-quantum-well field-effect transistor*, Journal of Applied Physics, vol. 94, No. 5, Sep. 1, 2003, 3556-3562.

V. V. Popov, *Tunable terahertz detection based on a grating-gated double-quantum-well FET*, Semiconductor Science and Technology, vol. 19 (2004) S71-S73.

\* cited by examiner

TERAHERTZ RADIATION MIXER

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to terahertz technology and, in particular, to a terahertz radiation mixer comprising a heterodyned field-effect transistor having a high electron mobility heterostructure that provides a gatable two-dimensional electron gas in the channel region.

BACKGROUND OF THE INVENTION

Terahertz technologies utilize electromagnetic radiation generally in the frequency range between 100 GHz and 10 THz (i.e, wavelengths of 3 mm to 30 μm, energies of 0.4 to 40 meV, or equivalent blackbody radiation temperatures of 5 K to 500 K). Many non-metallic materials that are visually opaque are partially transparent or exhibit molecular resonances in the terahertz region. In particular, water vapor and other small polar molecules have very strong rotational absorptions at terahertz frequencies. Therefore, terahertz technologies have many potential applications in diverse fields, including molecular spectroscopy, space and atmospheric sciences, plasma physics, biology, medical imaging, remote sensing, and communications.

Historically, there has been much interest in terahertz technologies for high-resolution (i.e., high Q) spectroscopy and remote sensing for space, planetary, and Earth science. For example, much of the interstellar medium radiates in the terahertz region, somewhat above the cosmic microwave background, enabling terahertz measurements to probe star formation and the early universe. Planetary atmospheres have background temperatures of tens to several hundred degrees Kelvin, enabling terahertz observation of extraterrestrial atmospheric conditions. Furthermore, thermal emission lines in the terahertz region from gases in the Earth's stratosphere and upper troposphere provide important indicators of ozone destruction, global warming, and pollution.

Terahertz signals can have a high bandwidth and are potentially useful for free-space communications. Therefore, terahertz technologies may be useful for space-based communications, such as satellite-to-satellite. However, limited atmospheric propagation, due to water and oxygen absorption, has discouraged the development of terahertz technologies for radar and terrestrial communications. Nonetheless, the technology may be attractive for relatively secure short-range communications, such as wireless communications in situations in which limited broadcast range is desirable.

A highly desirable application of terahertz technology is to do imaging of objects at useful standoff distances in real time for object or pattern recognition. Because terahertz irradiation does not involve the health and safety issues of ionizing radiation, such as are a concern with X-ray imaging, applications of terahertz technologies may include non-invasive tomographic imaging or spectroscopic characterization of biological materials. Because terahertz radiation is nondestructive and can penetrate non-metallic and non-polarizing external coverings (e.g., clothing, semiconductors, plastics, packaging materials), the technology may be useful in security screening for hidden explosives and concealed weapons. Finally, terahertz imaging may also be useful for industrial processes, such as package inspection and quality control.

However, beyond basic science, applications in the terahertz region are relatively undeveloped. Much progress is still required to provide field-deployable terahertz systems, especially for military, anti-terror, and biomedical imaging applications. Terahertz applications remain relatively undeveloped because the terahertz region lies between the traditional microwave and optical regions of the electromagnetic spectrum, where electronic or photonic technologies have been developed for these purposes. Terahertz applications have been hampered due to the historically poor performance of terahertz components lying in the "technological gap" between these traditional electronic and photonic domains.

In particular, the generation and detection of electromagnetic fields at terahertz frequencies has been difficult. To date, active terahertz generators have only demonstrated relatively low power capability. Traditional electronic solid state sources based on semiconductors roll-off at high frequencies. Tube sources are difficult to scale, due to the extremely high fields and current densities required. Therefore, frequency conversion techniques have typically been used to reach terahertz frequencies, including upconversion of millimeter waves using electronic or multiple harmonic techniques, or downconversion from the visible or near-IR using frequency mixing/switching or nonlinear optical processes. Recently, terahertz sources based on quantum cascade lasers (QCLs) have produced relatively high power in a compact size. Improvements in semiconductor materials systems suggest that a miniature terahertz QCL capable of generating a few milliwatts of output power at room temperature may soon be obtainable. Nonetheless, the weak radiation output from passive and active terahertz sources, the low photon energies of terahertz radiation, and high atmospheric attenuation due to molecular absorption (e.g., water vapor) frequently results in a weak received terahertz signal that may be difficult to distinguish from noise. Therefore, terahertz detection can also be difficult.

Current terahertz detectors include both direct and heterodyne detectors. Direct detectors generally directly convert the received power to a voltage or current that is proportional to the incoming power. They are characterized by responsivity (the ratio of the voltage output signal divided by the input signal power, in V/W) and noise-equivalent-power (NEP, the input signal power to the detector required to achieve a signal-to-noise ratio of unity after detection, in $W/Hz^{1/2}$). Examples of direct detectors include rectifiers, bolometers, and pyroelectrics. A common direct detector uses antenna coupling to a small area Schottky diode that responds directly to the THz electric field. Another direct detector is the conventional bolometer that consists of a radiation absorbing material that is coupled to a sensitive temperature-dependent resistor.

For shorter wavelengths (i.e., frequencies above 1 THz), direct detectors generally have good responsivity and are sensitive to a broad band of frequencies. However, direct detectors generally provide no frequency discrimination, unless they are coupled with an external resonator or interferometer. Furthermore, they are sensitive to incoherent background noise and interference. Finally, direct directors are typically very slow, with 1 to 10 ms response times required to obtain an adequate signal-to-noise. Therefore, direct detectors have been used mainly for wideband applications, such as thermal imaging.

There has been a need for a selective and tunable narrowband detector for terahertz spectrum analysis and imaging. Most solid state devices have had difficulty in this regard, because the electron energy relaxation times in such devices are typically much longer than the period of terahertz oscillations and terahertz energies are smaller than typical thermal energies. Therefore, the terahertz electromagnetic wave is oscillating too fast for free carriers to respond.

Recently, the direct detection of terahertz radiation by two-dimensional (2D) plasma waves has been demonstrated in a double-quantum-well (DQW) field-effect transistor (FET) with a periodic grating gate. See X. G. Peralta et al., *Appl. Phys. Lett.* 81, 1627 (2002) and X. G. Peralta et al., *Int. J. High Speed Elec. and Syst.* 12(3), 925 (2002), which are incorporated herein by reference. Plasma waves in a gated 2D electron gas (2DEG) can have relaxation times much shorter than electron relaxation times or transit times, and their excitation is not linked to an electronic transition. Therefore, coherent charge density oscillations (plasmons) in a high-mobility 2DEG can be exploited to circumvent ordinary electronic limits on maximum operating frequency in conventional solid state devices based on electron drift. As a result, the response of the DQW FET can be fast. This speed increase arises from the fact that 2DEG plasmons have energy relaxation times of order $10^{-10}$ sec., roughly ten times faster than for uncorrelated electrons. Also, typical 2DEG densities from $10^{10}$ to $10^{12}$ cm$^{-2}$ and device features of 1-10 μm yield plasmon frequencies in the 100 GHz-1 THz range, making plasmon devices attractive for terahertz applications. Furthermore, the ability to electrically tune the 2DEG charge density and hence the plasmon resonance via a gate voltage in the DQW FET enables the detection of specific, user-selected millimeter-wave to terahertz frequencies.

In FIG. 1 is shown the prior DQW FET 10 of Peralta et al. The DQW FET 10 was fabricated from a modulation doped GaAs/AlGaAs DQW heterostructure grown on a semi-insulating GaAs substrate 11 by molecular beam epitaxy. The two GaAs quantum wells (QWs) 12 and 13 were 20 nm wide and separated by a 7 nm AlGaAs barrier. The nominal electron densities in the QWs 12 and 13 were about $2\times10^{11}$ cm$^{-2}$. The 4.2 K mobility was about $1.7\times10^6$ cm$^2$/Vs. The upper QW 12 was buried 404 nm below the surface of the device. A 2 mm×2 mm mesa was defined by chemical etching and ohmic contacts to both QWs 12 and 13 were formed by evaporating and annealing NiAuGe over the edge and side of the mesa forming the source S and the drain D. A 70 nm thick TiAu grating gate 14 (with no metallization between the grating fingers) was evaporated on the surface of the device with the fingers of the grating parallel to the ohmic contacts, perpendicular to the current flow. The grating period was 4 μm.

The grating modulates the electron density in the QWs 12 and 13 under the metallized part of the gate 14 when a voltage $V_g$ is applied, selects wave vectors of the excited plasmon, and produces both normal and transverse THz electric fields. A voltage $V_{app}$ is applied to the drain D to establish a drain-source channel current $I_{DS}$. The current $I_{DS}$ is kept nearly constant using a load resistor R having a resistance much higher than the device resistance. The incident RF radiation 15 having frequency $f_{RF}$ resonates at the standing plasmon resonance and its spatial frequencies under the grating metallization, producing a photocurrent and leading to a decrease in the electrical resistance of the channel between the source S and the drain D. The photoresponse can be measured as change in an output drain-source voltage $V_{DS}$ that depends on the gate voltage $V_g$ and the frequency $f_{RF}$ of the incident terahertz radiation 15.

In FIG. 2 is shown the gate-bias-dependent photoresponse at T=25 K for different incident RF radiation frequencies $f_{RF}$ for a DQW FET 10 having the 4 μm grating period. The positions and strengths of the peaks in the photoresponse are controlled by both the voltage, $V_g$, applied to the gate 14 and the period of the grating gate. For 570 GHz, there is a resonance in the photoresponse around $V_g$=−1.6 V. The resonant peak moves to lower negative gate voltage, therefore higher electron density, as the frequency $f_{RF}$ of the incident radiation 15 is increased. At gate voltages more negative than −1.8 V, both QWs 12 and 13 are fully depleted under the metallic portion of the grating gate, and the channel is pinched off. With this grating period, the DQW FET 10 displays a measurement-limited resonant response from 0.57 to 0.66 THz, tunable by the applied grating gate voltage. The strength of the resonant photoresponse was observed to be maximal at temperatures between 25 to 40 K, decreasing at both lower and higher temperature.

While the DQW FET of Peralta et al. can be used as a selective and tunable direct detector for some applications, heterodyned detection is desirable for some terahertz applications. Particularly for weak signals, heterodyning can be used to coherently downconvert the terahertz signal to increase signal-to-noise by reducing bandwidth. The downconverted signal can then be post-amplified and processed using conventional microwave techniques. Heterodyne mixers beat the signal RF frequency against a known local oscillator (LO) frequency to generate an intermediate frequency (IF) difference signal that is tunable through the local oscillator frequency. Mixers are characterized by conversion gain (η, the ratio of the IF output power to the absorbed RF signal power, in dB), IF bandwidth (Hz), noise temperature (K), and LO power required. Mixers display good rejection of incoherent noise and interference. They are typically fast, with IF bandwidths of 0.1 to 10 GHz. Furthermore, narrowband detectors do not require additional frequency selective elements to analyze the spectrum of the incoming THz radiation as long as the received RF signal is within an IF bandwidth of the LO frequency. Therefore, heterodyne detectors have been used in narrow frequency band, high-resolution applications at lower terahertz frequencies, such as for molecular spectroscopy.

Common mixers are field-type devices that have a strong quadratic nonlinearity. For applications where the sensitivity of room-temperature detectors is adequate, Schottky diode mixers are preferred for downconversion. For high-sensitivity detection requiring cryogenic cooling, superconductor-insulator-superconductor (SIS) tunnel junction mixers have been used for sub-THz signals having energies below the superconducting bandgap. An alternative to the SIS mixer is the transition-edge or hot electron bolometer (HEB). HEB mixers are based on the heating of a superconducting microbridge with the THz radiation. The nonlinear I-V curve, necessary for mixing, results from the electron heating of the microbridge, which experiences a superconducting transition. Since the bridge resistance is dependent on the electron temperature, the device voltage is proportional to the THz power received. Furthermore, since the heated electrons have a very short relaxation time (e.g., less than 1 nanosecond), the HEB has a very low noise temperature and is capable of a high-speed operation, enabling heterodyning at signal frequencies up to several terahertz. However, a fast solid-state terahertz radiation mixer is still needed to enable coherent detection for terahertz applications requiring high resolution.

SUMMARY OF THE INVENTION

The present invention is directed to a terahertz radiation mixer for detecting an electromagnetic input signal having a radio frequency, comprising a FET having a heterostructure that provides a two-dimensional electron gas in the channel region between the source and the drain, and a periodic grating gate comprising a plurality of fingers on a front surface of the FET above the channel region to modulate the electron density in the two-dimensional electron gas; means for applying a gate voltage to the periodic grating gate; a local oscillator signal, incident on the front surface, that couples to the two-dimensional electron gas in the channel region and has a frequency detuned from the radio frequency of the input signal, thereby providing an output signal having a difference intermediate frequency; and means for detecting the output signal.

The heterostructure preferably comprises one or more quantum wells formed using compound semiconductors or Ge—Si alloys. For example, the quantum well can be an undoped GaAs layer sandwiched between donor-doped AlGaAs barriers that provide electrons to the high mobility GaAs well.

The gate voltage can be tuned to modulate the electron density under the grating gate so that the local oscillator signal resonates with a spatial frequency of a standing plasmon resonance of the two-dimensional electron gas in the channel region. When operated on a plasmon resonance, the mixer provides a narrowband response with an intermediate frequency that can be up to 10 GHz or greater. Alternatively, the gate voltage can be greater than the pinch-off voltage of the field-effect transistor to provide a broadband pinch-off response having higher sensitivity.

A transparent front gate or a back gate can also be used to modify the electron density and improve the performance of the grating-gated mixer. The channel-gate voltage variation can be reduced or eliminated by connecting the fingers of the grating gate in parallel with a resistive shunt and driving a small current through the shunt resistor. The absorption linewidth can thereby be narrowed to the intrinsic plasmon linewidth and the responsivity can be increased by operating the FET at higher currents. Alternatively, the fingers of the grating gate can be individually biased.

The input signal can have a radio frequency of between 100 GHz and a few THz. The local oscillator can have a relatively low power, less than a few mW, and a local oscillator frequency that is tunable to enable mixing over a broad spectral range. The intermediate frequency output signal can be detected as a photoconductive or a photovoltaic response to the incident radiation.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 1:
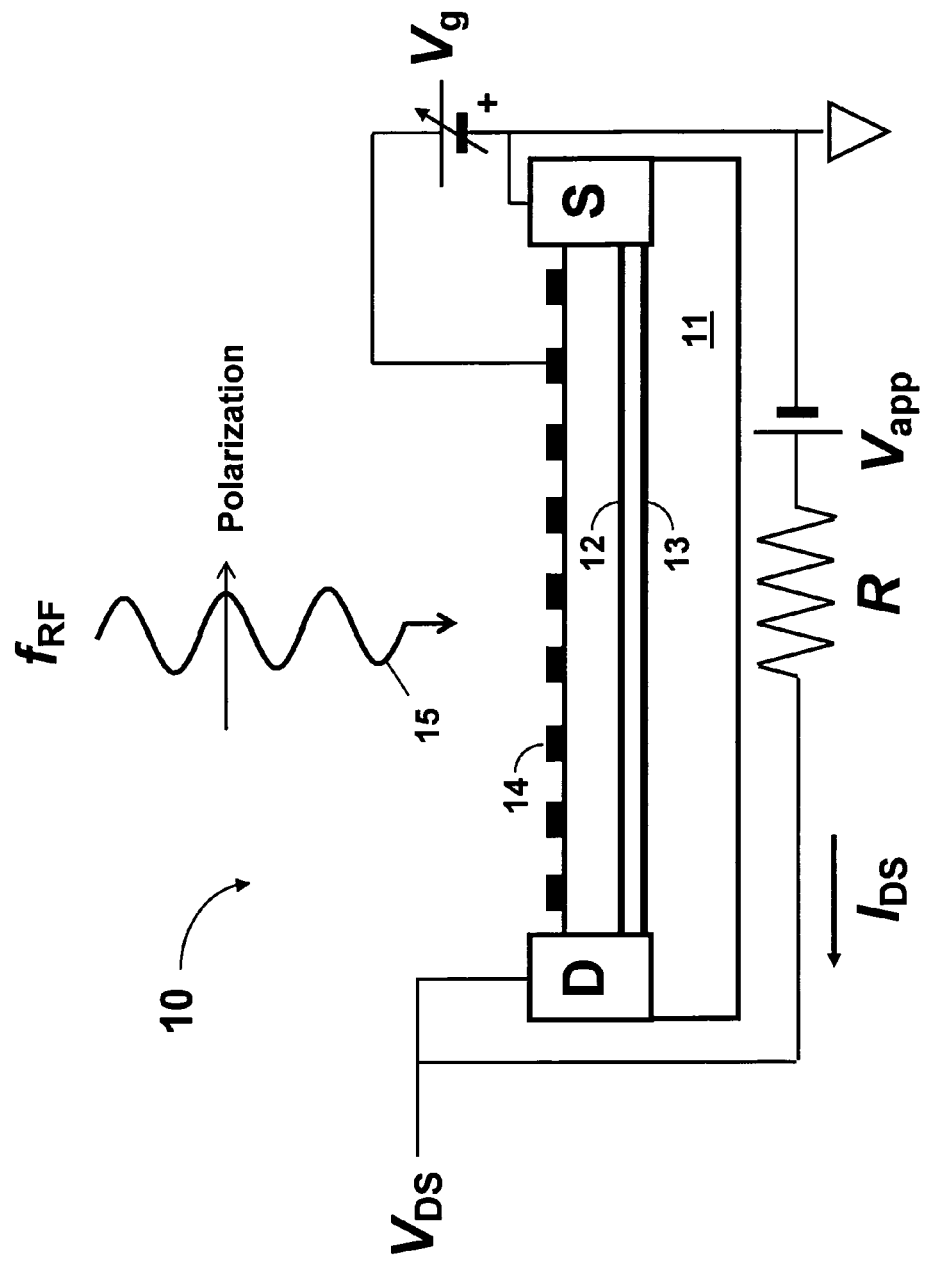
FIG. 1 shows a schematic side view illustration of a prior DQW FET with a periodic grating gate.
Figure 2:
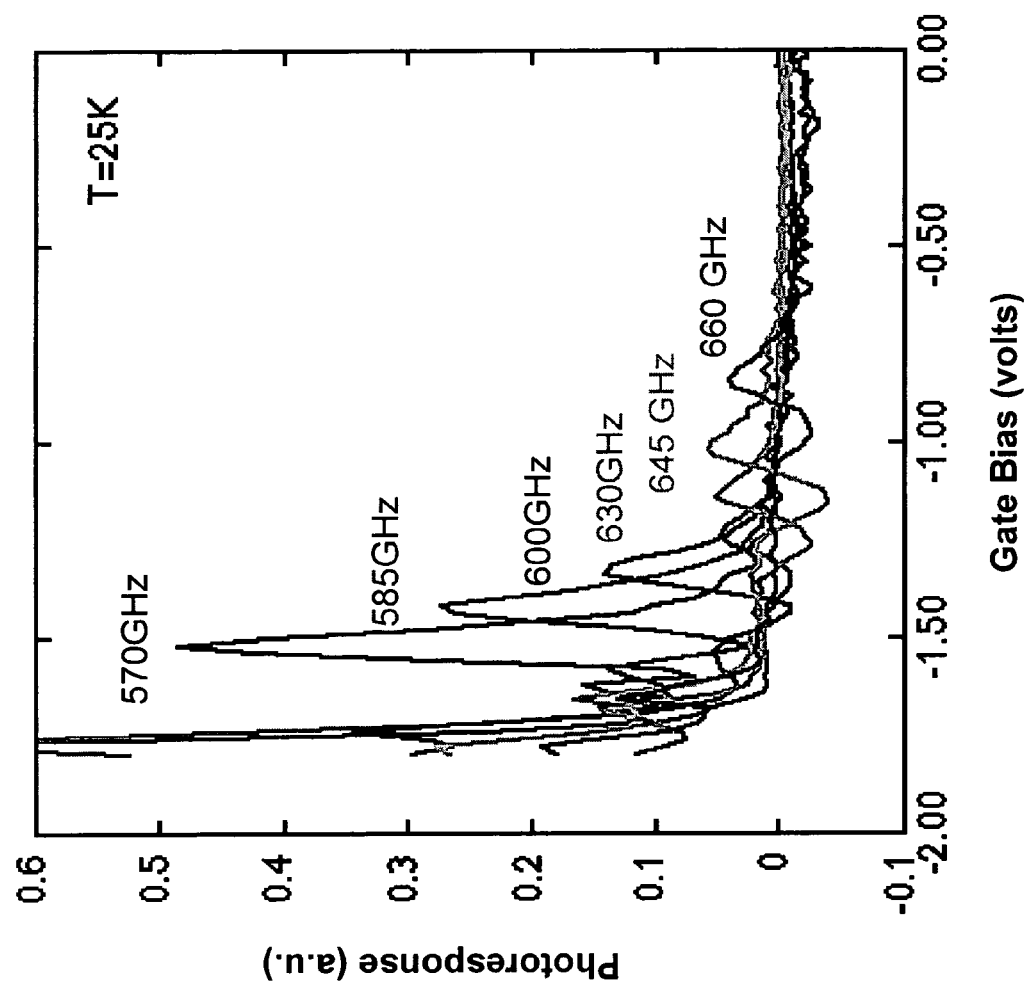
FIG. 2 shows a plot of the photoresponse as a function of gate voltage at six terahertz frequencies for the prior DQW FET. The temperature was T=25 K and the source-drain current was $I_{DS}$=100 µA. Grating period was 4 µm.
Figure 3:
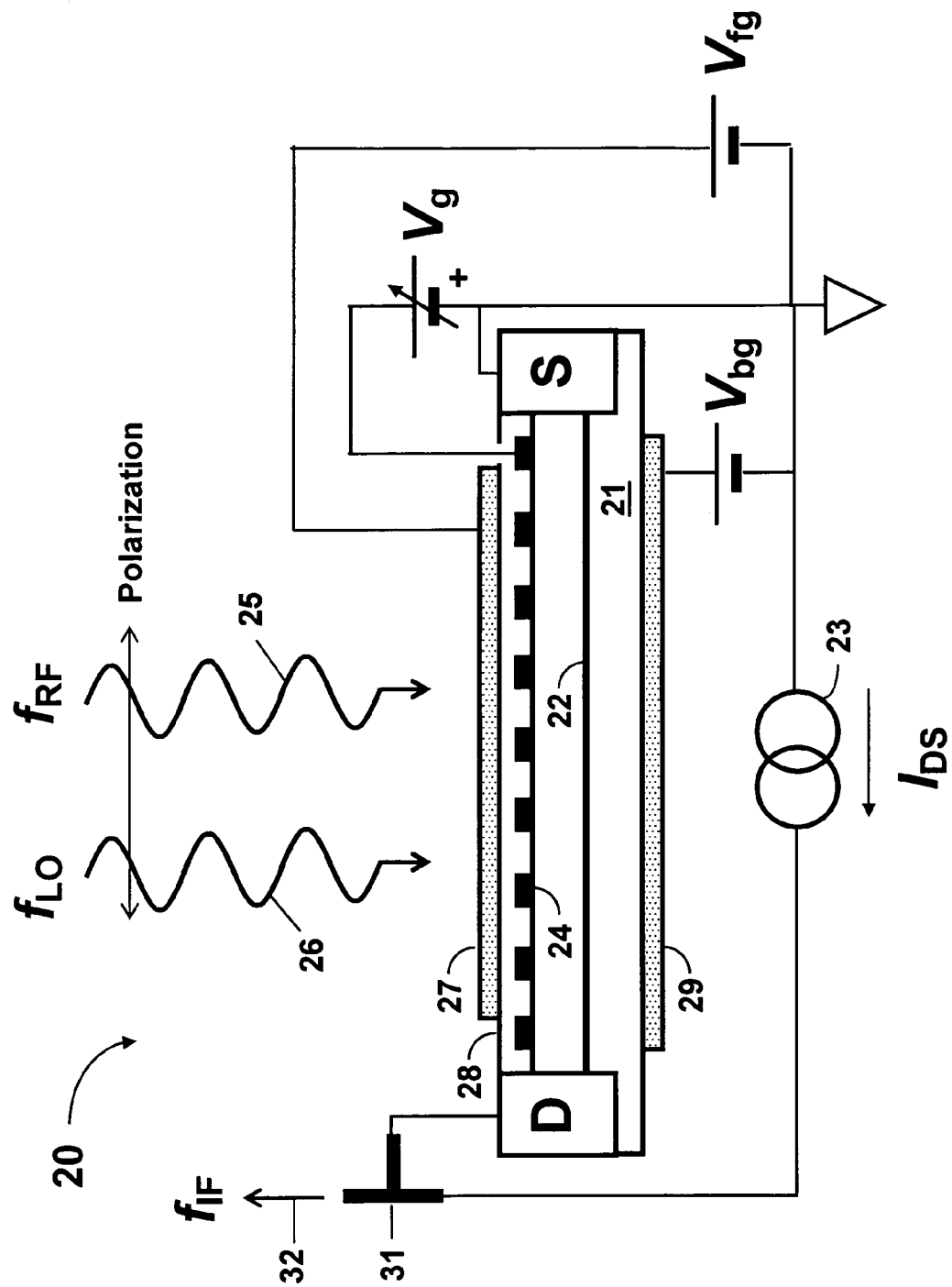
FIG. 3 shows a schematic side view illustration of a terahertz radiation mixer, comprising a heterodyned FET having a high electron mobility heterostructure that provides a gatable two-dimensional electron gas.

In FIG. 3 is shown a schematic side view illustration of a terahertz radiation mixer 20 of the present invention. The mixer 20 can be used as a frequency mixer of electromagnetic radiation in the millimeter to submillimeter wavelength frequency range, e.g., 100 GHz to a few THz. The mixer 20 comprises a heterodyned FET having a high electron mobility heterostructure 22 that provides a gatable 2DEG in the channel region between the source S and the drain D of the FET. The heterostructure 22 comprises dissimilar compound semiconductors, such as III-V or II-VI compound semiconductors, or Ge—Si alloys, formed in a semiconductor substrate 21. Preferably, the heterostructure 22 comprises one, or -more than one closely spaced high electron mobility QW layers. The high electron mobility QW can be a thin layer of a high purity compound semiconductor that is modulation doped by surrounding, wider band gap doped barriers. For example, the QW can be an undoped GaAs layer sandwiched between donor-doped AlGaAs barriers. Electrons from the doped AlGaAs barrier fall into the high mobility GaAs well and become trapped there, providing the 2DEG.

The mixer 20 has a surface metal gate 24 used to control the charge density in the underlying heterostructure 22. The gate 24 is patterned into a periodic grating that induces a spatial charge density periodicity in the heterostructure 22. The gate grating acts as an antenna having a broad incident beam area and narrow frequency bandwidth. The spatial charge density in the heterostructure 22 promotes coupling to certain wavelengths of incident electromagnetic radiation.

The 2D plasma angular frequency can be expressed as $$\omega_p = \left(\frac{n_s e^2 q}{m^* \bar{\epsilon}(q)}\right)^{1/2}$$

where $n_s$ is the channel density, q is the plasmon wavevector, $m^*$ is the electron effective mass, and $\bar{\epsilon}(q)$ is an effective dielectric constant which includes the semiconductor dielectric constant as well as the effect of the gate metallization. As the grating gate voltage $V_g$ is changed, the channel density, $n_s$, is swept and resonance appears when the plasma frequency equals the frequency of the incident radiation. The sensitivity to a specific millimeter or submillimeter wave frequency is electrically and continuously tunable over a broad frequency range of roughly a hundred GHz. The range of frequencies is dependent on both the nominal electron density of the 2DEG and the grating period. The electron density can be modified by changing the modulation doping of the heterostructure. Higher doping and small grating periods (e.g., 1 μm) provide higher operating frequencies (e.g., in excess of a terahertz). Lower doping and longer grating periods provide lower operating frequencies (e.g., 100 GHz or less). The electrical tunability acts as a built-in filter that rejects out-of-band noise and interference.

Alternative gate designs can also be used to modify the electron density and improve the performance of the grating-gated mixer 20. For example, a transparent uniform gate 27 can be formed on the front surface and separated from the grating gate 24 by an insulating layer 28. The transparent gate 27 can comprise a thin layer of a material (e.g., less than 10 nm thickness of titanium) that is conductive and transparent to the incident terahertz radiation in the frequency range of interest. A gate voltage $V_{fg}$ can be applied to the front gate 27 to independently control the electron density between the grating fingers. Alternatively, a back gate 29 can be provided on the back surface of the substrate (preferably, a thinned wafer) opposite the grating gate 24. The back gate 29 can be independently controlled via a back gate voltage $V_{bg}$. The front and back gate controls are not limited to depletion under the grating fingers and can therefore provide much larger variation in the carrier densities in the channel region. For example, the front and back gates 27 and 29 can be used to reduce the average density in the 2DEG and tune the plasmon frequency between the fingers to enhance the photoresponse.

Heterodyning consists of mixing the received RF signal 25 with a LO signal 26. The LO signal 26 has a frequency $f_{LO}$ that is different than the frequency $f_{RF}$ of the incoming RF signal 25. The mixer 20 produces an output signal 32 having an intermediate frequency $f_{IF}$ that is equal to the difference between the frequencies $f_{LO}$ and $f_{RF}$. The LO can have a fixed output power that is generally much greater than the power of the received RF signal. A nonlinear mixer produces an IF output power that is proportional to the product of the powers of the received RF signal and the LO signal. To first order, the IF power is given by $$P_{IF}(t) = (\sqrt{P_{LO}} \cos(2\pi f_{LO} t) + \sqrt{P_{RF}} \cos(2\pi f_{RF} t))^2 \approx P_{LO}^2$$
$$\sqrt{P_{LO} P_{RF}} \cos(2\pi f_{IF} t) + \ldots$$

where $P_{LO}$ is the LO power, $P_{RF}$ is the RF signal power, $f_{LO}$ is the LO frequency, $f_{RF}$ is the RF frequency, and $f_{IF}$ is the IF frequency. For a nonlinear mixer with a square-law response, only the cross-multiplication term at the fundamental IF frequency is important. The intermediate frequency $f_{IF}$ is therefore a beat note. If the difference frequency between the LO and the RF signals is sufficiently low, a detector will be able to follow the beat note at frequency $f_{IF}$ which can be easily amplified and processed.

For LO frequencies $f_{LO}$ above pinch-off, mixing occurs on the plasmon resonances from nonlinear plasmon interactions. The incident LO signal 26 resonates at the standing plasmon resonance and its spatial frequencies under the grating metallization. The DC gate bias $V_g$ changes the QW densities and hence the plasmon resonances with the LO field. The conversion gain of the mixer 20 operating on a plasmon resonance is largely due to the strongly nonlinear character of the plasmon interactions.

The LO power requirements for the mixer 20 can be low when operating at a plasmon resonance. This advantage comes from the fact that the charge excitations generated by the electromagnetic field are resonant, as opposed to non-resonant as occurs with prior art bolometer or diode detector/mixers. The LO source preferably has adequate incident power to optimize the conversion gain. For example, the LO power can typically be 0.1 to a few mW. Preferably, the LO source is tunable so that the mixer has a broad spectral range. For example, the LO source can be a Gunn oscillator, a solid-state multiplier, a backward-wave oscillator, a far-infrared gas laser, or a quantum cascade laser.

The IF bandwidth for the mixer 20 can be very wide when operating on a plasmon resonance, yielding a very fast device with relatively broad frequency coverage around the LO frequency. The IF bandwidth will be approximately ½Q of the plasmon resonance frequency, where Q is the resonance full width at half maximum power. Taking realistic Q values of 10 to 20 and plasmon resonances in the 100 to 1000 GHz range, the IF bandwidth can be in the range of 10 to 30 GHz. This bandwidth provides improved sensitivity, background rejection, and enhanced spectral resolution. The range is comparable to Schottky diodes and is faster than HEBs in the prior art.

In a photoconductive detection mode (as shown), the drain-source can be dc biased by a current source 23 through a wideband bias tee 31 to provide a nearly constant drain-source bias current $I_{DS}$ (e.g., 10-100 μA). The incident radiation at the plasmon resonance produces a photocurrent, leading to a decrease in the electrical resistance of the channel. The photoresponse generated by the FET can be output through the bias tee to a low-noise amplifier (not shown). Therefore, the IF signal 32 can be detected as a microwave drain-source signal superimposed on a fixed dc drain-source current.

The responsivity of the direct detector (and, therefore, the gain conversion of the mixer) is dependent on the applied bias current. Increasing the current bias increases the responsivity. However, increasing the current also raises the drain voltage and the variation in the channel-gate voltage along the length of the channel. This variation in the channel-gate voltage changes the electron density and, therefore, the absorption frequency along the length of the channel, increasing the absorption linewidth.

Figure 4:
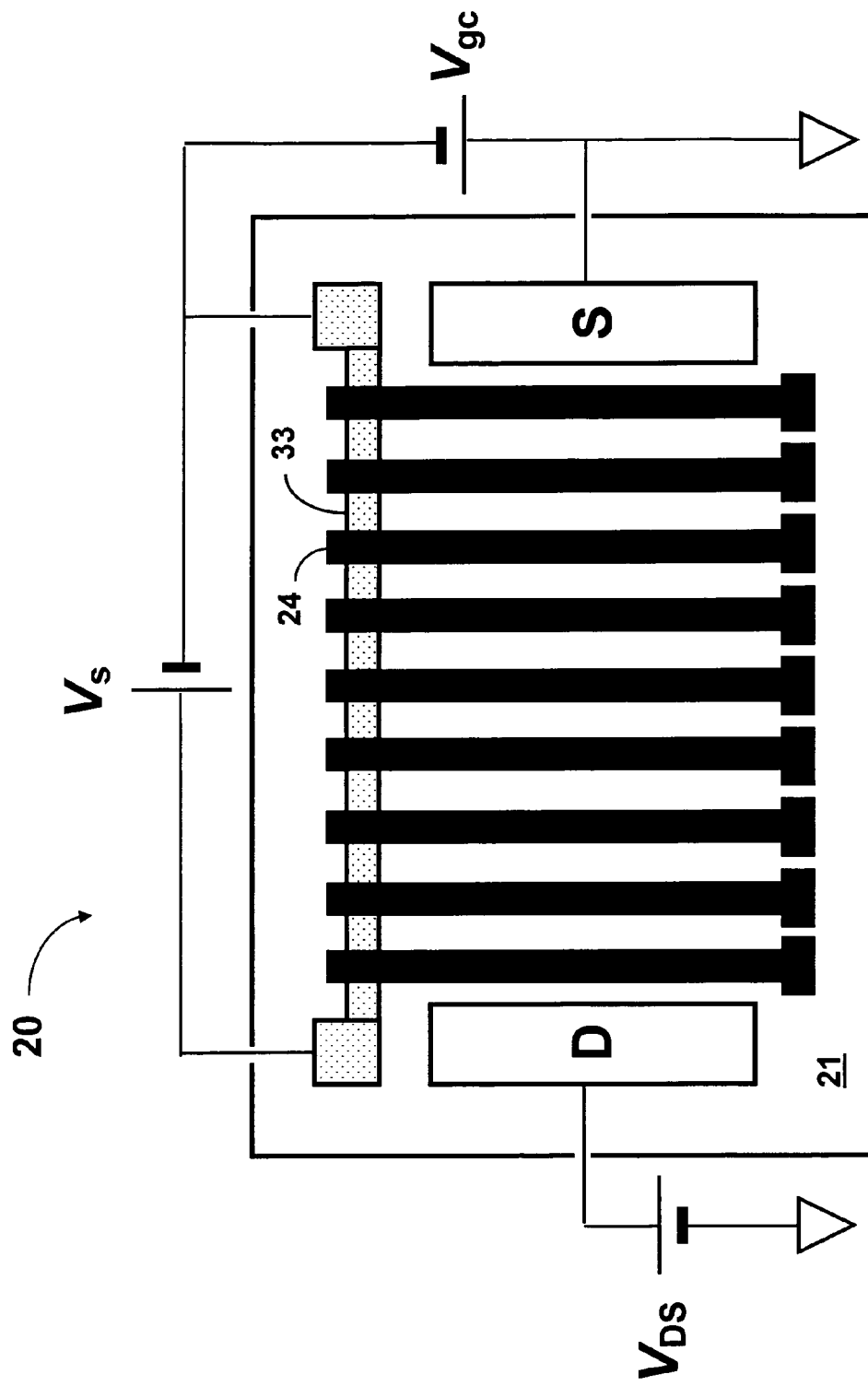
FIG. 4 shows a schematic top view illustration of a terahertz radiation mixer, comprising a shunt resistor that connects the grating gate fingers of the heterodyned FET in parallel.

As shown in FIG. 4, the channel-gate voltage variation can be reduced or eliminated by connecting the fingers of the grating gate in parallel with a resistive shunt 33. A shunt voltage Vs equal to the drain voltage VDS can be applied to drive a small current through the resistive shunt 33. The shunt 33 can be a high resistivity material, such as nichrome. The voltage difference between adjacent grating fingers 24 is equal to the voltage drop in the 2DEG per each period of the grating, thereby keeping the gate-channel voltage $V_{gc}$ constant for each grating finger. The absorption linewidth can thereby be narrowed to the intrinsic plasmon linewidth and the responsivity can be increased by operating the FET at higher currents.

The mixer 20 can alternatively be operated in a photovoltaic detection mode (i.e., no applied drain voltage). In the photovoltaic mode, a forward voltage will appear across the drain-source when the channel region is illuminated by the incident radiation at the plasmon resonance. Power can then be delivered from the FET to a small series resistor (not shown). The IF signal can be detected as a microwave drain-source voltage. Therefore, the photovoltaic mode enables lower power operation of the device, because no constant bias current is applied while the device is in the quiescent state.

The mixer 20 can also be operated in a pinch-off mode having a broadband response that is insensitive to the LO frequency. In the pinch-off mode, the carrier density is reduced (by using a large negative gate bias) to near pinch-off conditions, thus increasing the temperature coefficient of the channel resistance $dR_{DS}/dT$. Use of a high-mobility QW or heterostructure means that a high responsivity can be achieved without a large sacrifice in detector speed. The resulting enhanced conversion gain can be significantly larger than prior art semiconductor bolometric mixers.

The ability to operate in either the pinch-off mode or the resonant plasmon mode means that the mixer 20 can shift from a broadband frequency survey (in pinch-off mode) to tuned narrow-band detection (in plasmon mode) in a single device by changing a single DC voltage control (the gate bias).

Figure 5:
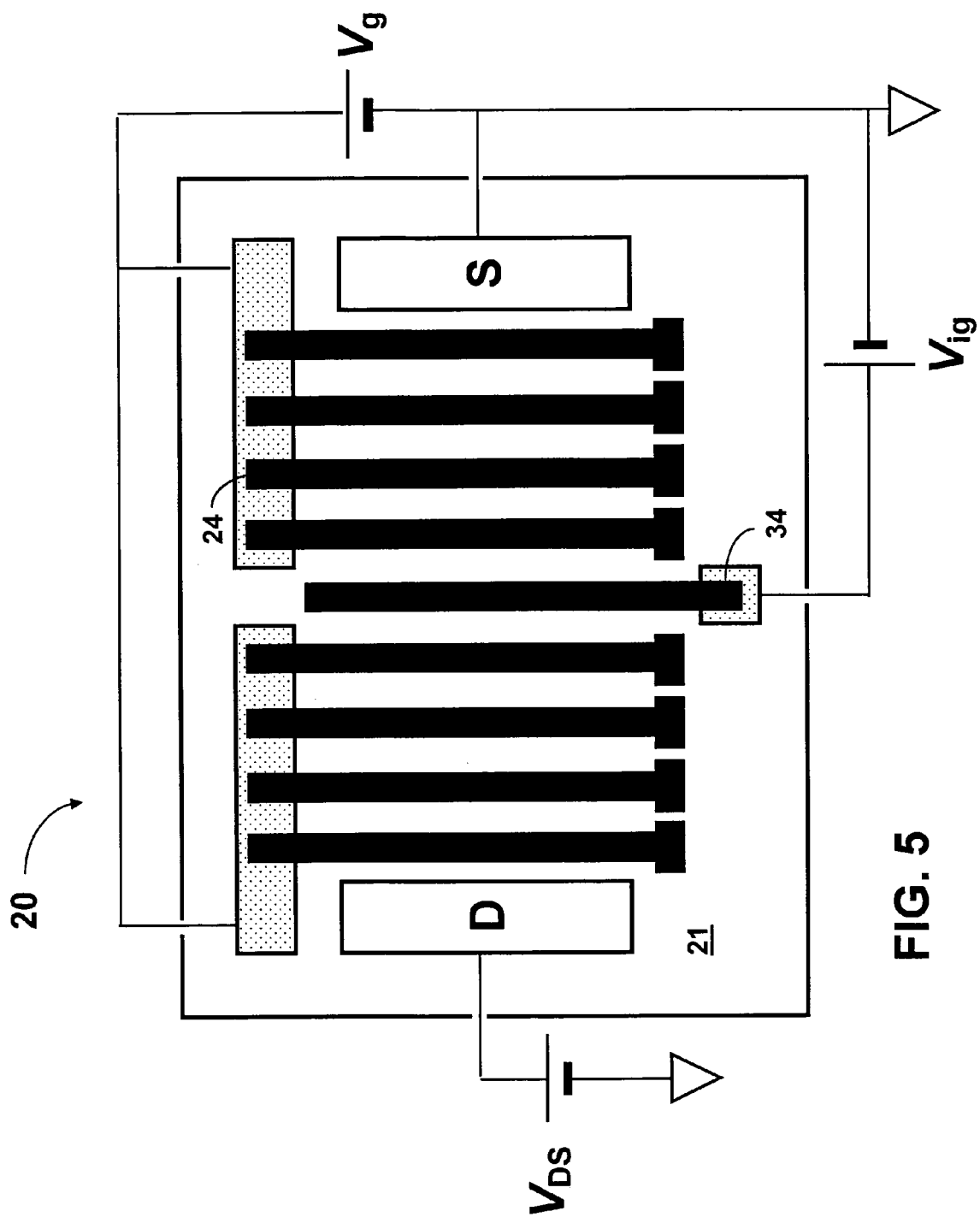
FIG. 5 shows a schematic top view illustration of a terahertz radiation mixer, comprising individually biased grating gate fingers.

Alternatively, the individual fingers of the grating gate can be biased at different voltages. This enables grating gates with different grating periods on the same device or the grating gate of a plasma resonator to be monolithically integrated with a pinch-off mode detector. For example, in FIG. 5 is shown a schematic top view illustration of a mixer 20, comprising a grating gate 24 that is split by an individually biased finger 34. The split grating gate 24 can be biased at the grating gate voltage $V_g$ and the finger 34 can be biased at the individual gate voltage $V_{ig}$ to locally pinch off the channel. This split gate mixer can enhance the responsivity of the plasmon resonance mode and improve the tunability of the pinch-off mode.

Experimental Results for a DQW FET Mixer

The heterodyne mixing characteristics of a terahertz radiation mixer of the type shown in FIG. 3 were examined. The mixer was a grating-gated GaAs—AlGaAs DQW FET designed to have plasmon resonances between 100 and 200 GHz. The basic grating-gated DQW FET examined had the same basic design as described in detail in Peralta et al. However, the period of the grating gate used was 16 μm (8 μm metal/8 μm gap), rather than 4 μm, as used by Peralta et al. The larger period selects out longer wavelength plasmon modes that were used in the 94-145 GHz mixing measurements. Otherwise, the composition of the DQW heterostructures was the same (i.e., two 20-nm-wide GaAs QWs, modulation doped at $1.7 \times 10^{11}$ cm$^{-2}$ (upper QW) and $2.6 \times 10^{11}$ cm$^{-2}$ (lower QW) separated by a 7 nm AlGaAs barrier). The device area covered by the grating gate was 2 mm×2 mm. At T=4 K, the Hall mobility of the composite heterostructure was $\mu=1.7 \times 10^6$ cm$^2$/Vs, giving a net momentum relaxation time $\tau=m^*\mu/e\sim 65$ ps and a mean free path at 4 K exceeding 10 μm. Therefore, electrons transit the ungated 8 μm gaps beneath the gate grating in a semiclassical ballistic manner.

Figure 6:
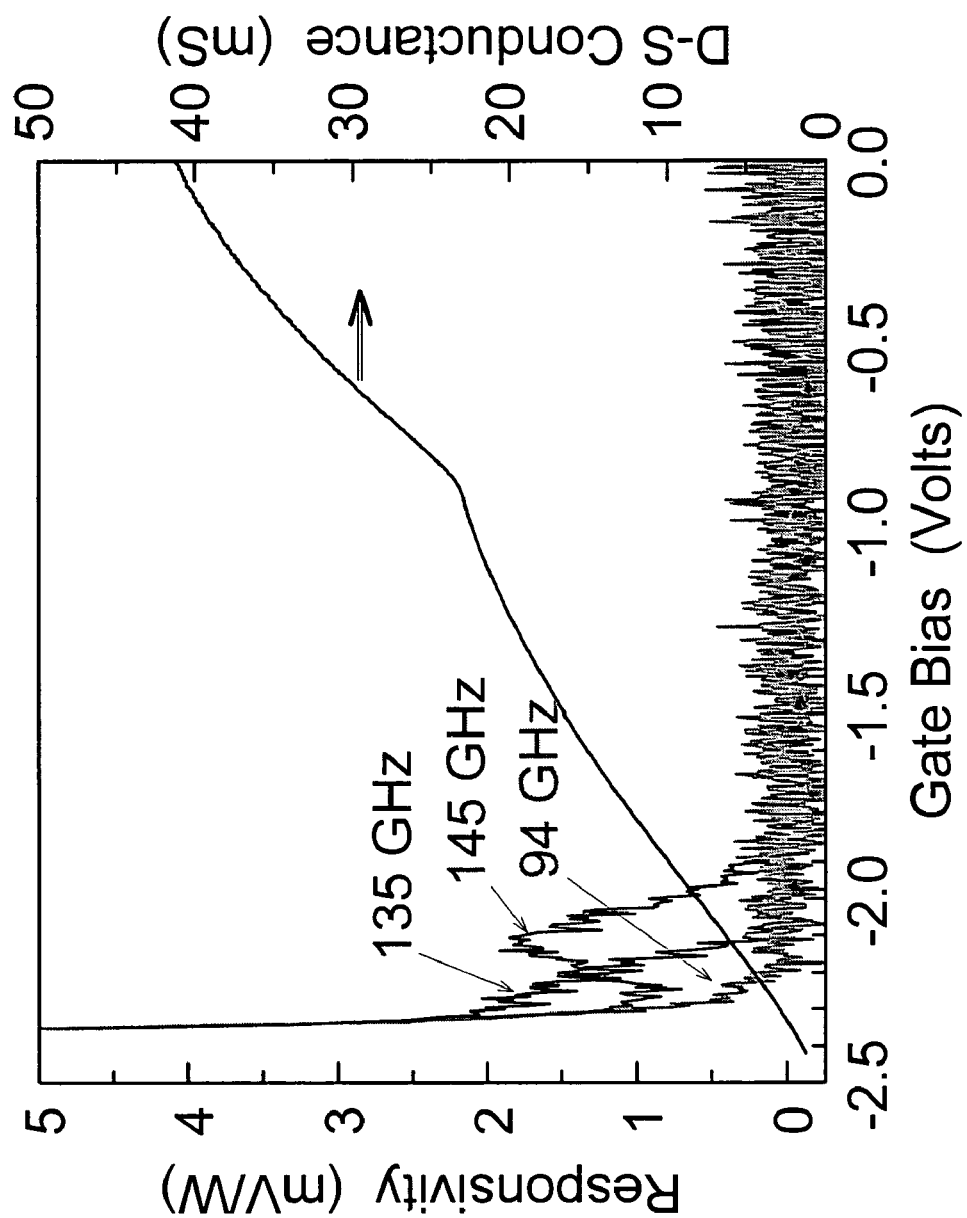
FIG. 6 shows a plot of the drain-source conductance and responsivity (37 Hz chopping rate) with 10 µA current bias in response to 94, 135, and 145 GHz radiation, as a function of gate bias. The kink in the conductance at $V_g$=−0.8 V indicates the depletion of the upper quantum well under the grating gate electrodes.

In FIG. 6 is shown a plot of the drain-source (D-S) conductance versus gate bias for the DQW FET operating as a direct detector (i.e., without the incident LO signal). At about $V_g=-0.80$ V, the 2DEG in the upper QW is fully depleted under the metallic portion of the grating gate, forming an array of disconnected 8 μm stripes, as indicated by the kink in the D-S conductance plot. As the gate voltage becomes more negative, the 2DEG in the lower QW is also patterned into stripes until pinch-off occurs and the conductance goes to zero at about $V_g=-2.45$ V, when both QW layers are cut off from the source and drain.

Also shown in FIG. 6 is a plot of the responsivity as a function of gate bias at three different frequencies, 94, 135, and 145 GHz when the DQW FET was operated as a direct detector. The responsivity shown is the change in drain-source voltage δVDS at the 37 Hz chopping rate of the incoming radiation divided by the nominal RF power incident at the sample position. Two different response regimes are evident. Above pinch-off, a clear resonant response to 145 GHz radiation is centered at $V_g=-2.11$ V, the signature of a plasmon excitation as reported in Peralta et al. The resonant responsivity magnitude is about 2 mV/W, uncorrected for the fact that the device area was smaller than the nominal beam waist. At slightly more negative gate bias, to $V_g=-2.25$ V, a partial resonance peak in response to 135 GHz radiation is apparent just above pinch-off. This resonance redshift is consistent with the decrease in 2DEG density. No resonance in response to 94 GHz radiation is seen, as the gate bias required is below pinch-off. Pinched off at $V_g=-2.4$ V, the responsivity curves for all three frequencies share a common, large rise that goes up to almost 50 mV/W, independent of frequency. This larger responsivity near pinch-off is thus broadband.

For the mixing measurements, the DQW FET was attached to a 4 K cryostat plate behind a cold long-wavelength pass filter and a Teflon window. The gate-source was biased at gate voltages $V_g$ between 0 and −2.5 V. Gate leakage was less than 10 pA, even at the most negative gate bias. The drain-source was dc biased at $I_{DS}=10$ μA through a wideband bias tee. LO signal and RF signal radiation was provided by a pair of F-band Gunn oscillators (maximum output power 35 mW) focused through a 300-mm-diam Gaussian lens antenna to a beam waist diameter of approximately 5 mm. Polarization was orthogonal to the gate grating fingers. Attenuation was adjusted so that 0.1-1 mW of LO power and 1-10 μW of RF power were incident at the sample plane, as measured by a power meter set at the sample position inside the cryostat. The IF signal generated by the mixer was output through the bias tee to a low-noise amplifier mounted on the 4 K plate and the IF frequency was measured by a spectrum analyzer. The instrumental IF bandwidth was 2 GHz, limited by the amplifier and the reactance from the parasitic inductance of a wire bond contact.

The DQW FET mixer exhibited two physically distinct mixing responses, dependent on the 2DEG density via the gate bias. Near pinch-off, the device behaved as a broadband mixer that was insensitive to the LO. Away from pinch-off, the device behaved as a narrowband mixer with a plasmon response that was electrically tunable to the LO.

Figure 7:
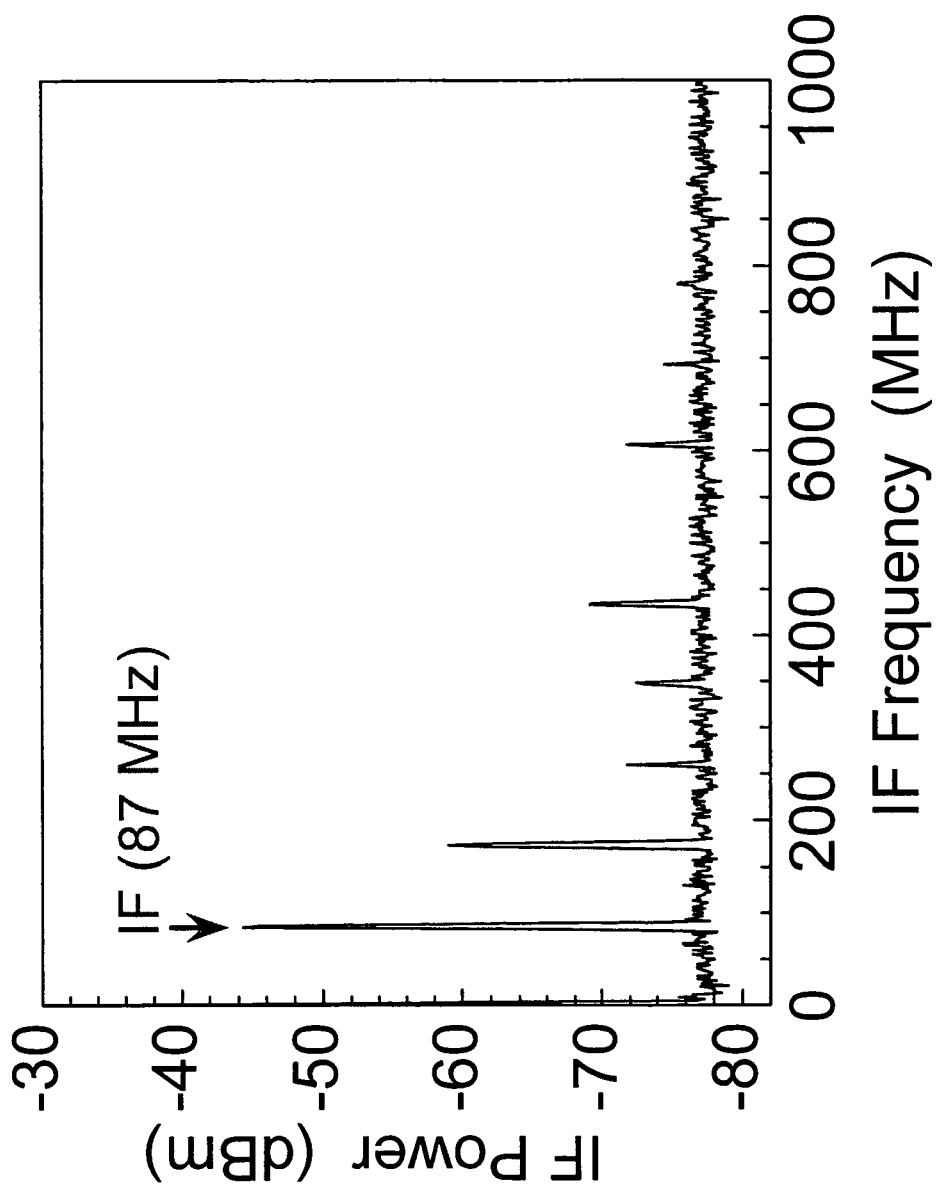
FIG. 7 shows a plot of the power spectrum of the IF output generated by heterodyne mixing on a fixed 145 GHz RF signal with a LO signal detuned by 87 MHz from the RF signal. The gate bias was held at the peak of the 145 GHz plasmon resonance response (i.e., gate voltage=−2.1 V).

In FIG. 7 is shown the resonant plasmon spectrum of the IF power from the mixer for a 145 GHz RF signal and a LO signal detuned from the RF signal to give a fundamental IF of 87 MHz. The spectrum was obtained with a gate voltage of $V_g=-2.11$ V, at the peak of the 145 GHz plasmon. This spectrum shows a complicated series of harmonics of the IF, with the 2 IF harmonic smaller than, but comparable to, the fundamental, and detectable harmonics up to 9 IF. The IF harmonics generated by plasmon mixing indicate non-ideal behavior that is a stronger than square-law response.

Figure 8:
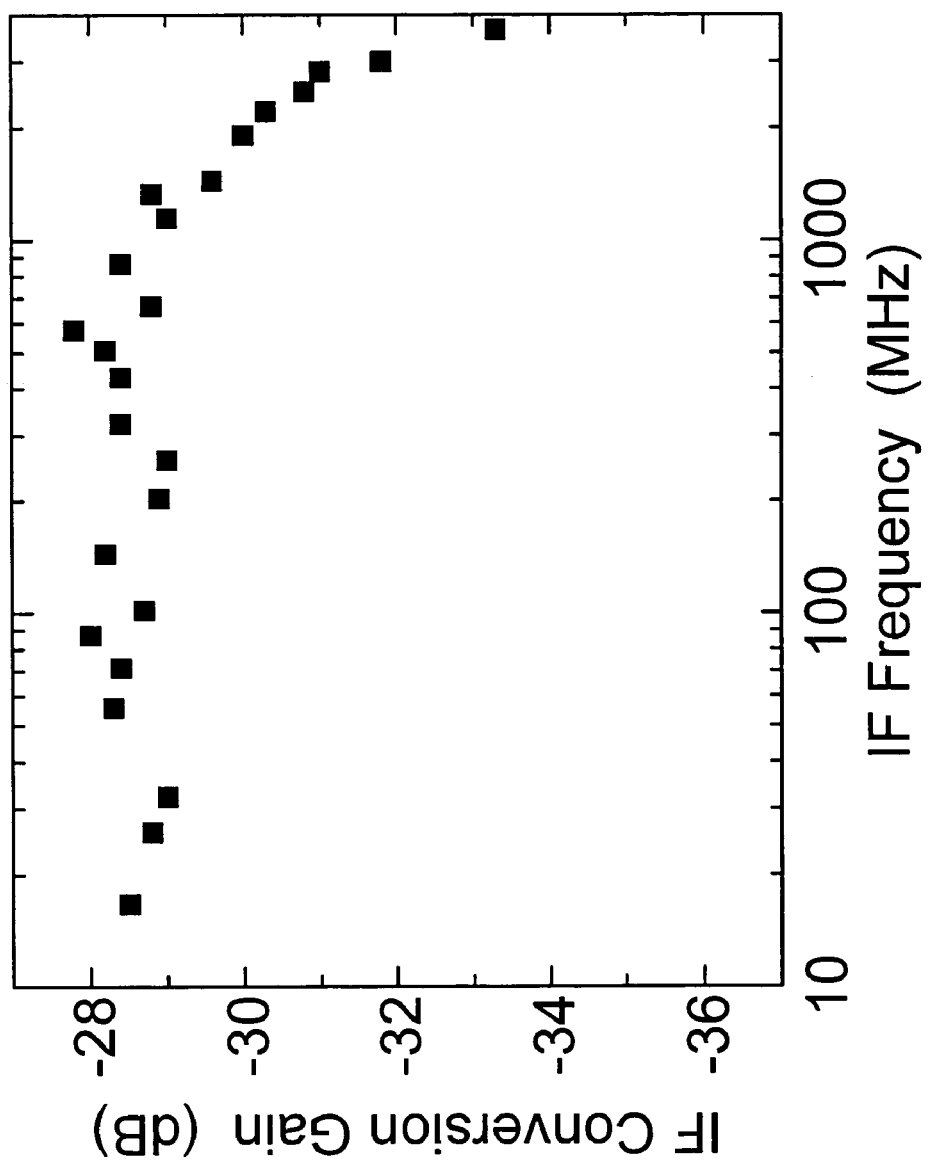
FIG. 8 shows a plot of the IF dependence of the mixer conversion gain, normalized to 18 MHz, for a 145 GHz RF signal, with the gate voltage held at the 145 GHz plasmon resonance (i.e., gate voltage=−2.1 V).

In FIG. 8 is shown a plot of the mixer conversion gain $\eta=P_{IF}/P_{RF}$ as a function of the IF, where $P_{IF}$ and $P_{Rf}$ are the IF output and RF input powers, with the LO power fixed at 0.1 mW and the RF signal frequency fixed at 145 GHz. The data were taken at $V_g=-2.11$ V, on the 145 GHz plasmon resonance. The data were corrected for the losses and gains in the IF signal chain. The IF bandwidth, defined as the IF where η falls 3 dB below its low-frequency value, significantly exceeds the 2 GHz instrumental limit, which on this plot appears as a rapidly degenerating signal to noise for the data above about 1 GHz. More recent measurements with broader bandwidth instrumentation have indicated that the actual IF bandwidth is about 8 GHz for these parameters.

Figure 9:
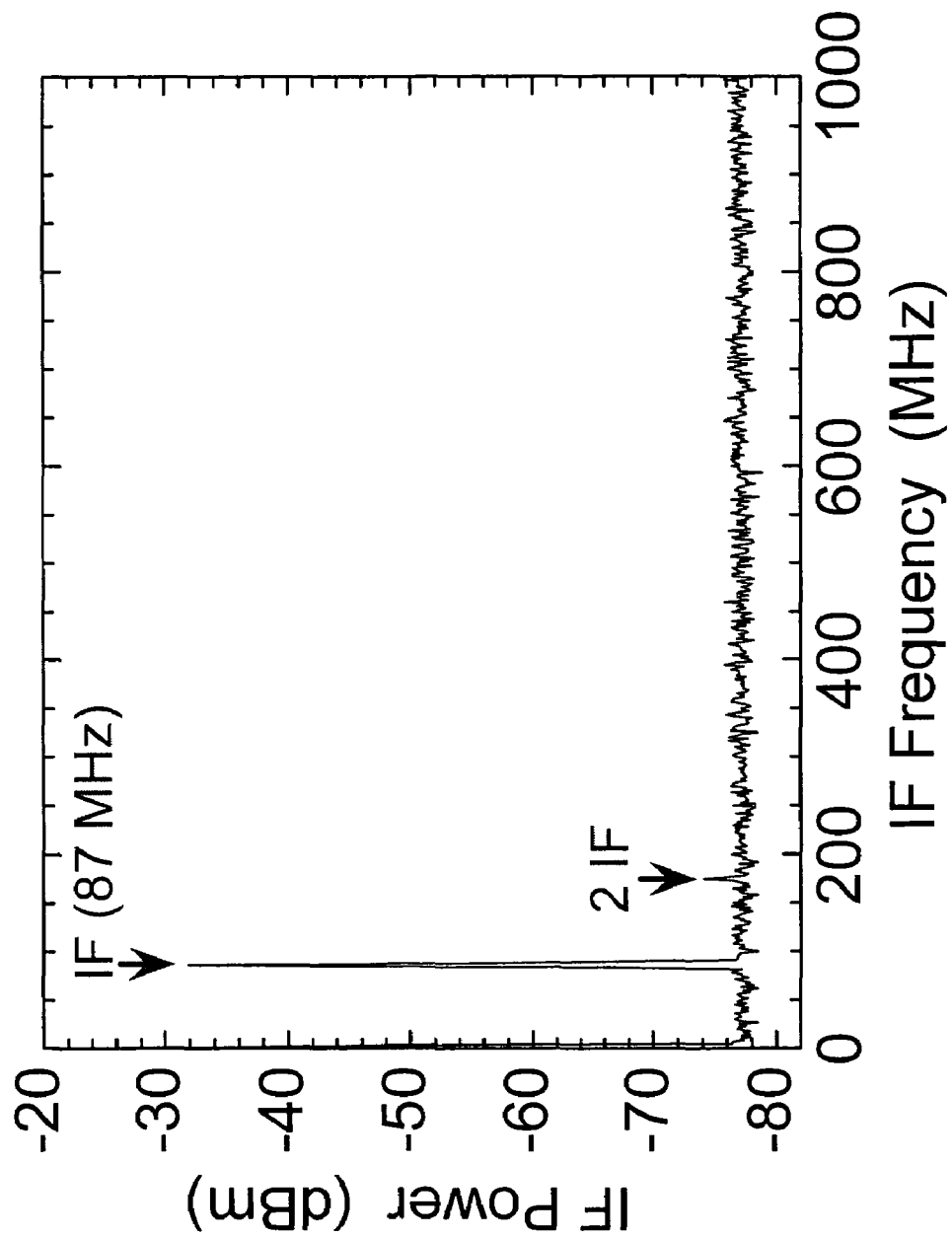
FIG. 9 shows a plot of the power spectrum of the IF output generated by heterodyne mixing on a fixed 145 GHz RF signal with a LO signal detuned by 87 MHz from the RF signal. The gate bias was held in the broadband pinch-off response (i.e., gate voltage=−2.5 V).

The mixer was also operated in the pinch-off mode. In FIG. 9 is shown the conversion gain vs. IF spectrum for the DQW FET, obtained using the same parameters as above except with $V_g=-2.42$ V, in the pinch-off response. The broadband response is insensitive to the LO frequency at gate biases more negative than −2.4 V. The spectrum consists almost solely of the fundamental IF with only a very small 2 IF distortion. The fact that the spectrum is nearly free of harmonic distortion means that the difference frequency is generated by a nearly pure cross multiplication term, characteristic of a square-law mixer.

Figure 10:
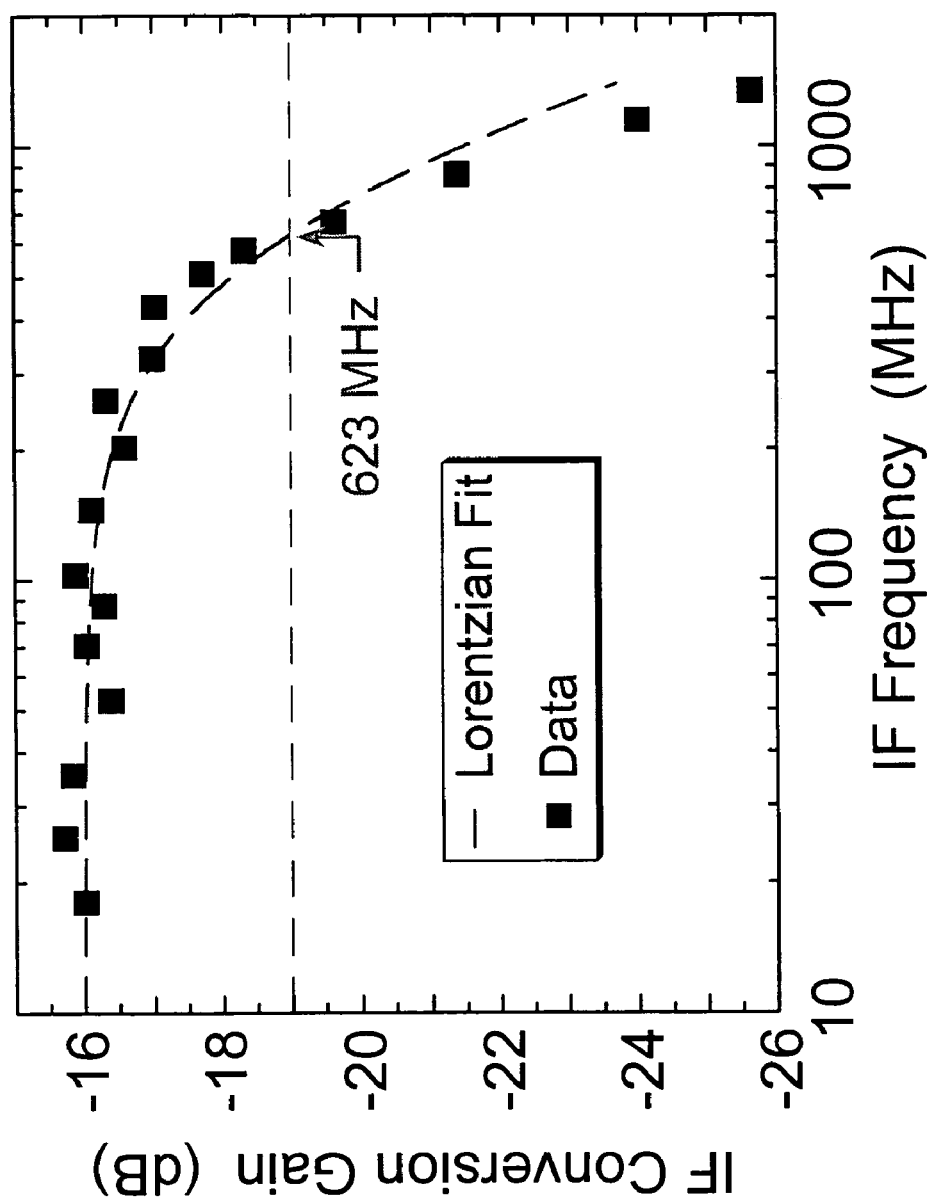
FIG. 10 shows a plot of the IF dependence of the mixer conversion gain, normalized to 17 MHz, for a 145 GHz signal, with the gate voltage held in the broadband pinch-off response (i.e., gate voltage=−2.5 V). The data is fit to a Lorentzian, which indicates a −3 dB IF bandwidth of 620 MHz.

In FIG. 10 is shown a plot of the conversion gain, obtained using the same parameters as above, except with $V_g=-2.42$ V, in the pinch-off response. The intrinsic conversion gain is $\eta=-16$ dB at an IF of 18 MHz, with a 0.1 mW LO power and 1 µW signal power at an IF of 18 MHz. In this regime the IF bandwidth is less than 1 GHz and can be reasonably fit to a Lorentzian. The Lorentzian curve fit in FIG. 10 indicates an IF bandwidth of 620 MHz. For pinch-off mixing the IF dependence of the conversion gain should be a Lorentzian: $\eta=(1+(f_{IF}/f_{3dB})^2)^{-1}$, where the IF bandwidth $f_{3dB}$ is set by the thermal relaxation time. The 620 MHz $f_{3dB}$ near pinch-off is more consistent with a hot-electron bolometer, rather than a conventional bulk bolometer which usually has $f_{3dB}$ in the kHz to few MHz range.

Figure 11:
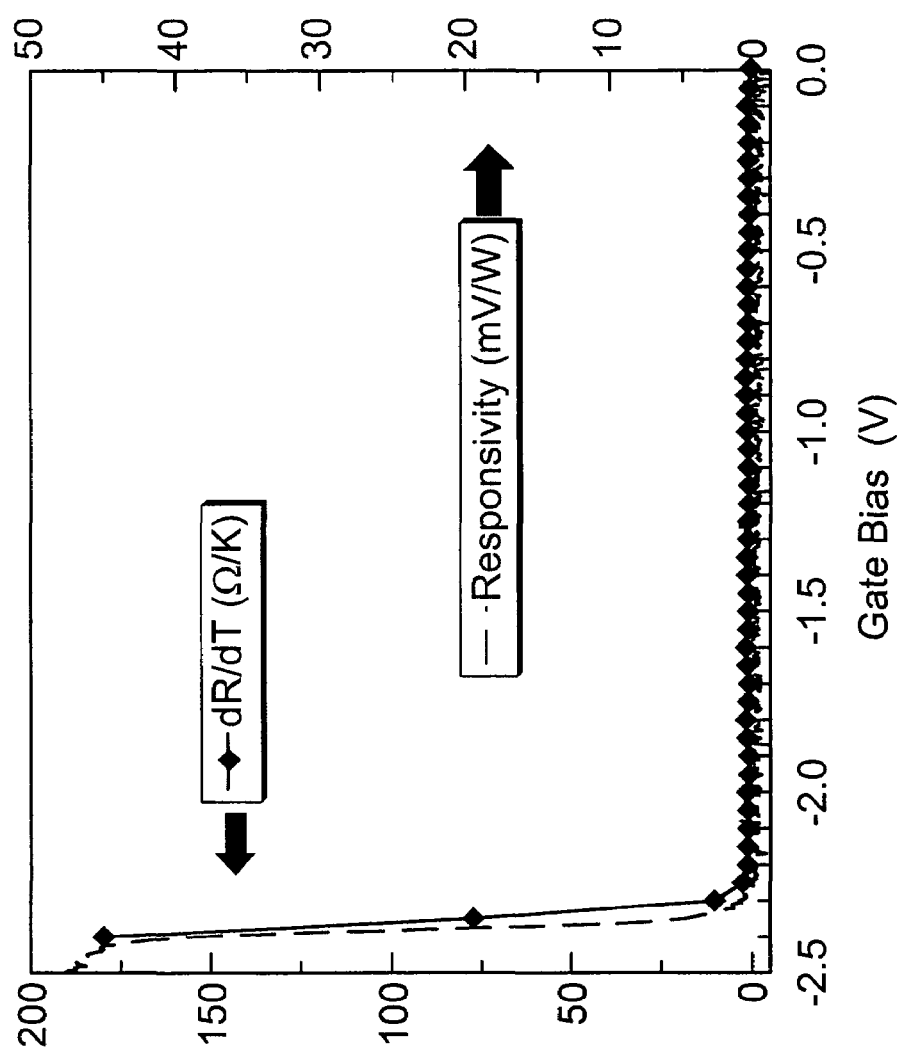
FIG. 11 shows a plot of the responsivity at 94 GHz and the temperature slope of the drain-source resistance $dR_{DS}/dT$, both plotted against gate bias near a temperature of 4 K.

In FIG. 11 is shown a plot of the responsivity at 94 GHz and $dR_{DS}/dT$ as a function of $V_g$ near 4 K, where $R_{DS}$ is the source-drain channel resistance. The responsivity tracks closely the behavior of $dR_{DS}/dT$ as a function of $V_g$, both quantities being small and nearly independent of $V_g$ for most of the bias range but showing a sudden large and proportionate increase at the same $V_g$.

The present invention has been described as terahertz radiation mixer. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A terahertz radiation mixer for detecting an electromagnetic input signal having a radio frequency, comprising:
   a field-effect transistor formed in a semiconductor substrate, comprising a heterostructure that provides a two-dimensional electron gas in the channel region between the source and the drain of the field-effect transistor, and a periodic grating gate comprising a plurality of fingers on a front surface above the channel region to modulate the electron density in the two-dimensional electron gas;
   means for applying a gate voltage to the periodic grating gate;
   a local oscillator signal, incident on the front surface, that couples to the two-dimensional electron gas in the channel region and has a frequency detuned from the radio frequency of the electromagnetic input signal, incident on the front surface, thereby providing an output signal having a difference intermediate frequency; and
   means for detecting the output signal.

2. The terahertz radiation mixer of claim 1, wherein the gate voltage is tuned to modulate the electron density under the grating gate so that the local oscillator signal resonates with a spatial frequency of a standing plasmon resonance of the two-dimensional electron gas in the channel region.

3. The terahertz radiation mixer of claim 2, wherein the intermediate frequency has a bandwidth greater than 1 GHz.

4. The terahertz radiation mixer of claim 3, wherein the intermediate frequency has a bandwidth greater than 10 GHz.

5. The terahertz radiation mixer of claim 1, wherein the gate voltage is greater than the pinch-off voltage of the channel.

6. The terahertz radiation mixer of claim 1, wherein the heterostructure comprises one or more quantum wells.

7. The terahertz radiation mixer of claim 6, wherein the heterostructure comprises two quantum wells.

8. The terahertz radiation mixer of claim 1, wherein the heterostructure comprises dissimilar III-V compound semiconductors, II-VI compound semiconductors, or Ge—Si alloys.

9. The terahertz radiation mixer of claim 8, wherein the dissimilar III-V compound semiconductors comprise GaAs and AlGaAs.

10. The terahertz radiation mixer of claim 1, wherein the electromagnetic input signal has a radio frequency of greater than 100 GHz.

11. The terahertz radiation mixer of claim 1, wherein the detecting means comprises measuring the photoconductive response of the mixer to the local oscillator signal and the electromagnetic input signal.

12. The terahertz radiation mixer of claim 1, wherein the detecting means comprises measuring the photovoltaic response of the mixer to the local oscillator signal and the electromagnetic input signal.

13. The terahertz radiation mixer of claim 1, wherein the local oscillator signal is tunable.

14. The terahertz radiation mixer of claim 1, wherein the power of the local oscillator signal is less than 3 mW.

15. The terahertz radiation mixer of claim 1, wherein the local oscillator signal is provided by a Gunn oscillator, a solid-state multiplier, a backward-wave oscillator, a far-infrared gas laser, or a quantum cascade laser.

16. The terahertz radiation mixer of claim 1, further comprising a back gate on the opposite side of the channel region from the grating gate.

17. The terahertz radiation mixer of claim 1, further comprising a transparent gate on the front surface above the channel region.

18. The terahertz radiation mixer of claim 17, wherein the transparent gate material comprises titanium.

19. The terahertz radiation mixer of claim 1, further comprising a resistive shunt that connects the fingers of the grating gate in parallel and means for applying a shunt voltage to the resistive shunt.

20. The terahertz radiation mixer of claim 19, wherein the shunt voltage is equal to the drain voltage.

21. The terahertz radiation mixer of claim 1, wherein at least one of the fingers of the grating gate of the grating gate is individually biased.

22. The terahertz radiation mixer of claim 21, wherein the at least one finger is biased to greater than the pinch-off voltage of the channel.

* * * * *